United States Patent [19]

Trussell et al.

[11] 4,144,573

[45] Mar. 13, 1979

[54] METERING SYSTEM

[75] Inventors: Gerald C. Trussell, Park Ridge; James R. Caruth, Chicago; Phillip Jalowiec, Chicago; Michael J. Pociask, Chicago, all of Ill.

[73] Assignee: Sun Electric Corporation, Crystal Lake, Ill.

[21] Appl. No.: 736,082

[22] Filed: Oct. 27, 1976

[51] Int. Cl.² ........................ G06F 3/05; G01M 15/00
[52] U.S. Cl. .................................. 364/506; 364/551; 364/565; 364/511
[58] Field of Search .................... 235/151.3, 151.32; 324/163–165, 169, 16 T; 73/116; 340/324 R; 364/506, 510, 511, 565, 556, 551

[56] References Cited
U.S. PATENT DOCUMENTS

| | | | |
|---|---|---|---|
| 3,800,128 | 3/1974 | Kurk | 235/151.32 |
| 3,820,712 | 6/1974 | Oswald | 235/151.32 |
| 3,875,388 | 4/1975 | Luten et al. | 235/151.32 X |
| 3,936,663 | 2/1976 | Taylor et al. | 235/151.32 X |
| 3,968,434 | 7/1976 | Dixon et al. | 235/151.32 X |
| 3,972,224 | 8/1976 | Ingram | 235/151.3 X |
| 3,972,230 | 8/1976 | Hanson et al. | 235/151.3 X |
| 3,975,952 | 8/1976 | Lacher, Jr. et al. | 235/151.3 X |
| 4,027,532 | 6/1977 | Trussell et al. | 235/151.3 X |

*Primary Examiner*—Edward J. Wise
*Attorney, Agent, or Firm*—Allegretti, Newitt, Witcoff & McAndrews

[57] ABSTRACT

The present invention is a metering system including a signal conditioning circuit, processor and output system. The signal conditioning circuit receives a state-indicating signal and responsively produces a repetitive digital signal compatible with the processor. The processor samples the repetitive digital signal, determines the period thereof and produces an output signal having a value related to the state-indicating signal. The output system displays the value of the output signal.

29 Claims, 16 Drawing Figures

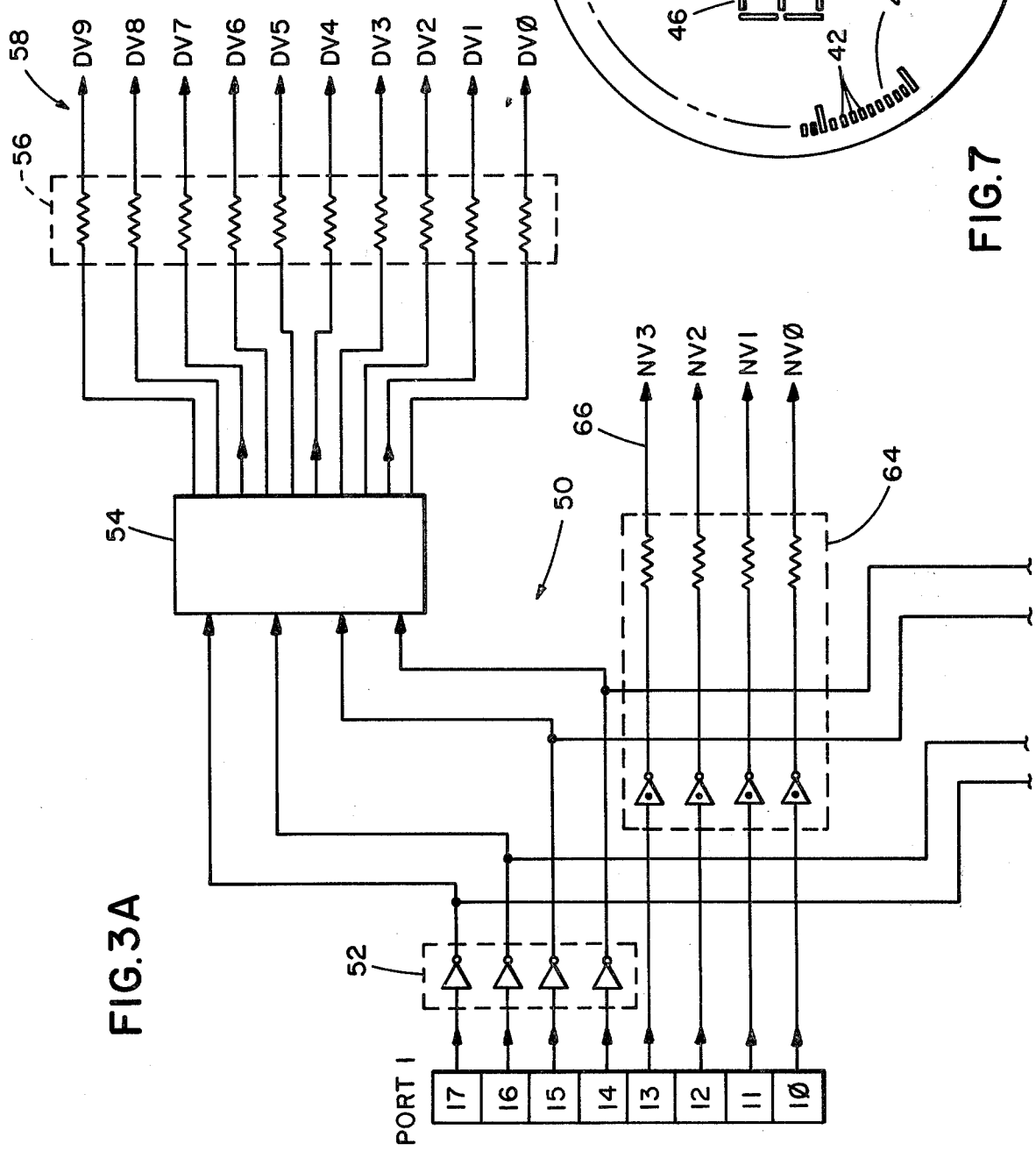

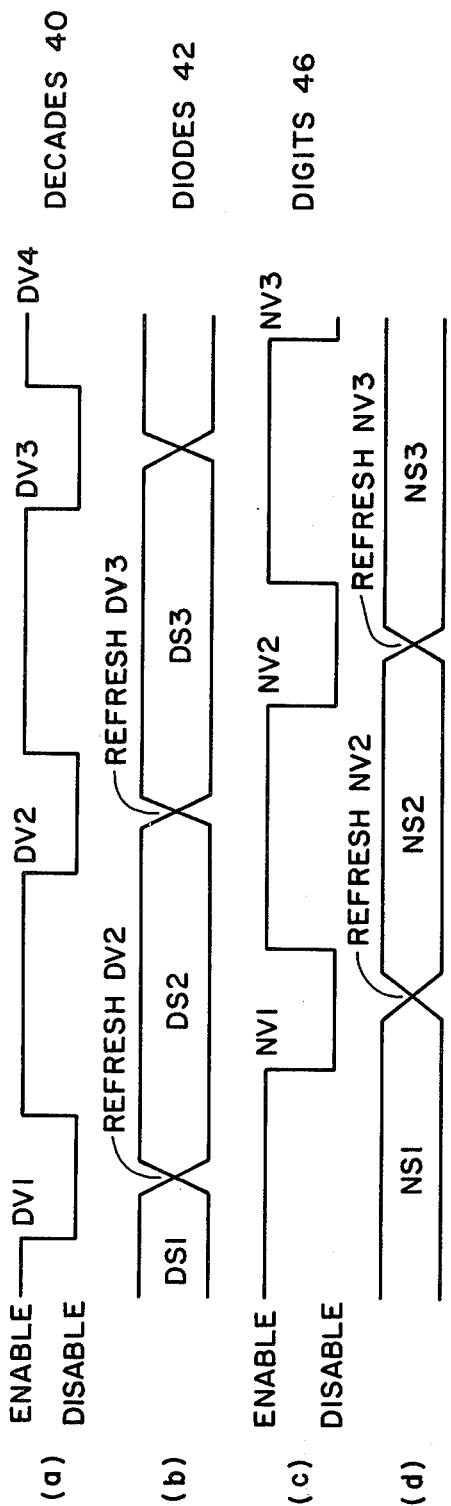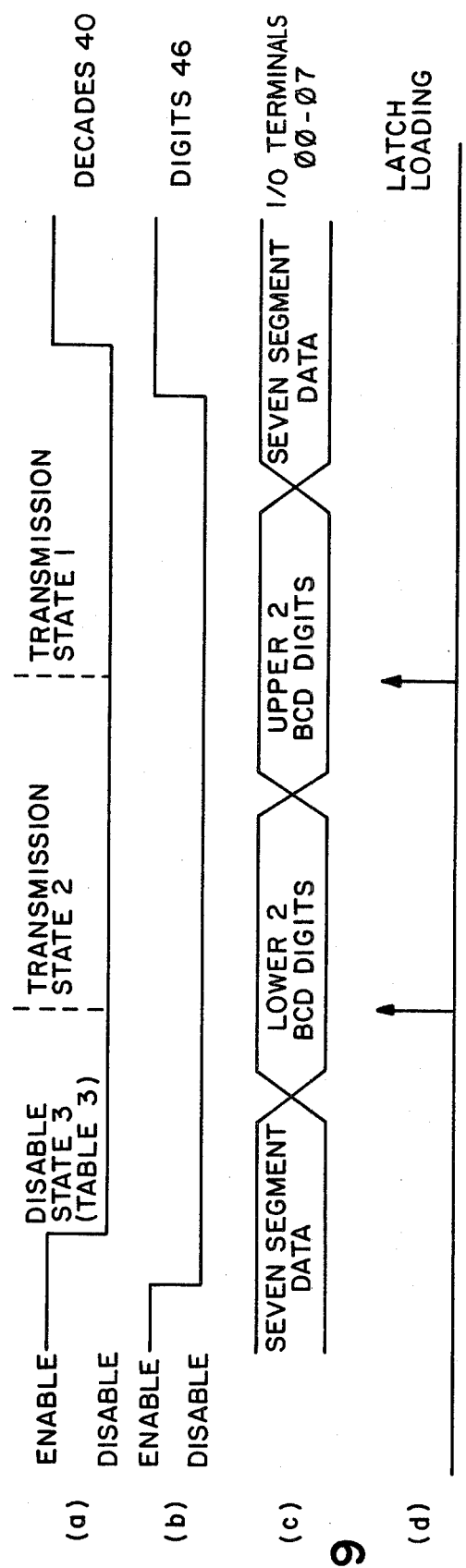
FIG. 8
FIG. 9

SYSTEM OPERATION

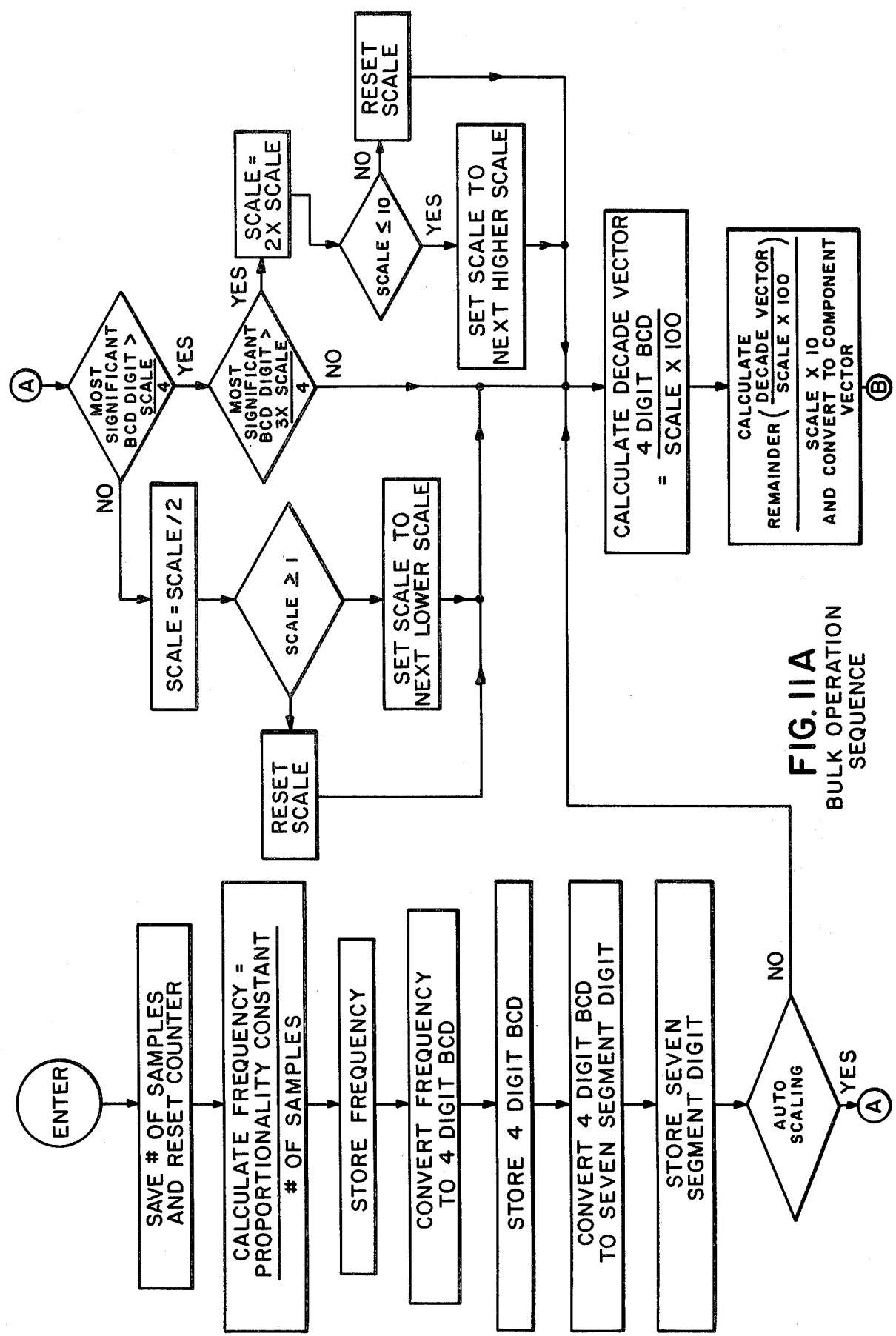

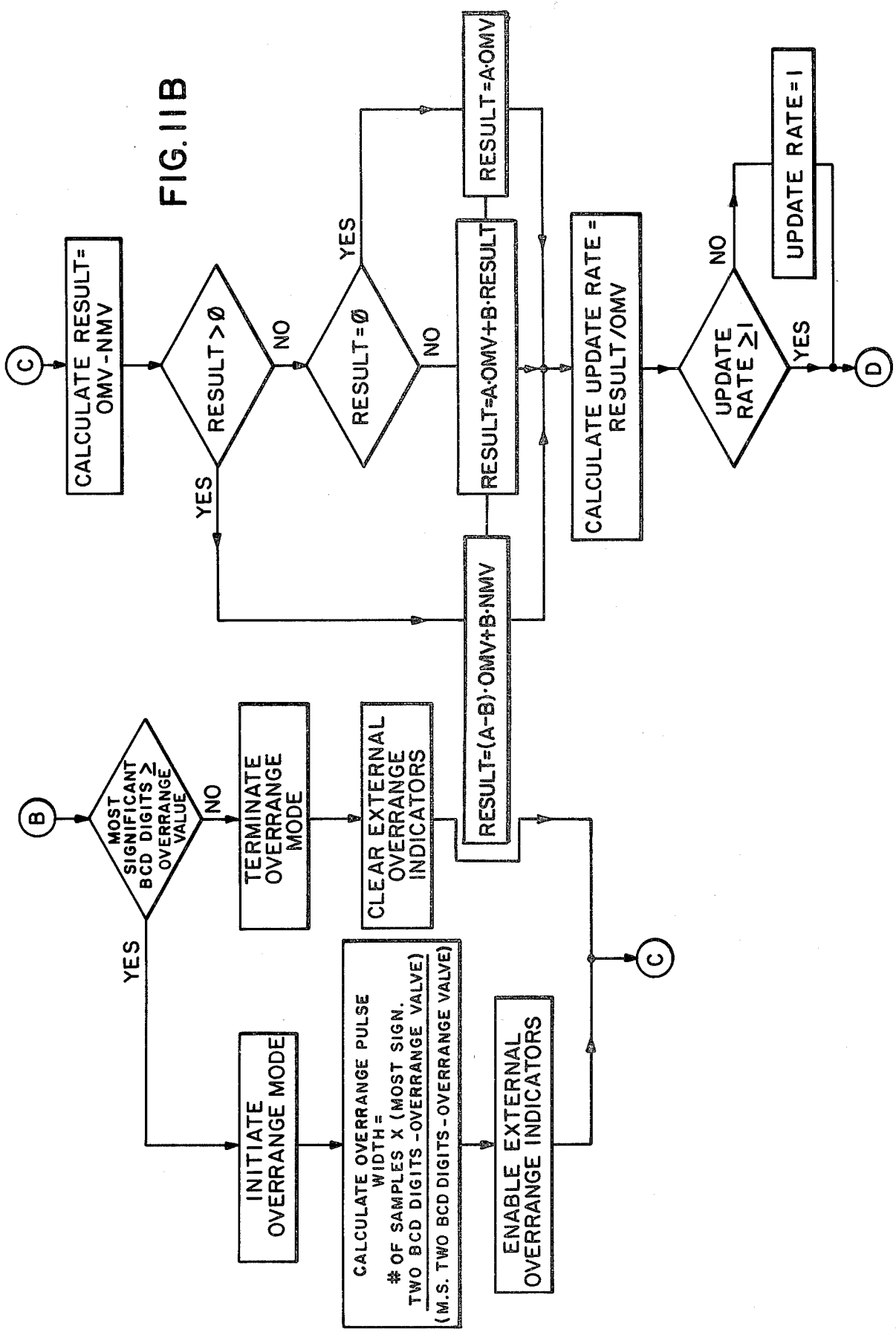

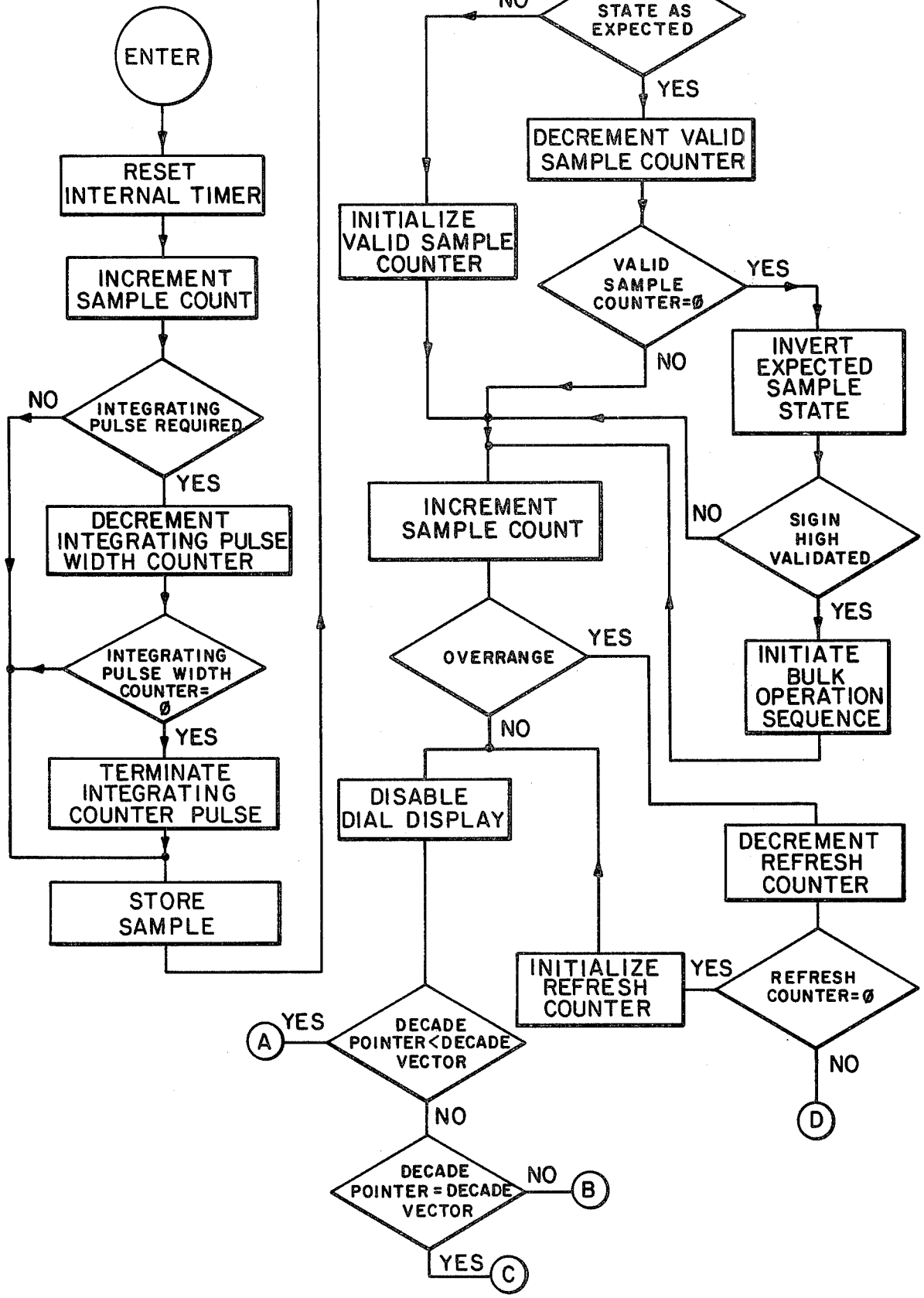

METERING SYSTEM

BACKGROUND OF THE INVENTION

The present invention relates generally to a metering system and more particularly to a digital measurement and display system, operated under processor control.

Many digital display systems have been developed to overcome the inherent shortcomings of the more conventional and basic analog display systems. These inherent shortcomings derive primarily from meter inaccuracy and observer interpolation.

However, the digital display systems themselves present problems. One has been characterized as the "rolling numbers" phenomenon. Rapid variance in the input signal is detected and displayed with digital techniques; consequently the displayed value changes so quickly that it becomes useless. Further, the digital display does not tend to indicate, as well as the analog display, the direction and rate of change of the displayed state or condition.

The present invention substantially overcomes and avoids the cited problems of digital display systems. In a preferred embodiment, the present invention, a metering system, includes a signal conditioning circuit, processor and output system.

The signal conditioning system receives a state-indicating signal and responsively provides a repetitive, digital input signal compatible with the processor. It is to be understood that the type of state-indicating signal is insignificant, as the signal conditioning system provides appropriate conversion to a periodic, two-state signal.

The processor samples the digital input to determine the period thereof and manipulates the sampled data to appropriately drive the output system. The processor dynamically updates the output signal. i.e., updates in relation to the rate of change of the state-indicating system. This provides more accurate tracking and display of the state or condition under analysis.

In another embodiment of the present invention, the processor initially validates the repetitive digital input signal to suppress aberrations therein, such as noise. The processor interprets the input signal and removes thereof extraneous information.

In yet another embodiment, the output system of the present invention incorporates a group of output displays, each having a series of individual output components. The processor successively enables each output display with a first output signal and actuates a predetermined number of individual output components within each output display with a second output signal.

It is thus an object of the present invention to provide an accurate and reliable digital metering system. Another object is to provide a digital metering system wherein rapid variations in the measured condition, not indicative of true condition fluctuations, are substantially suppressed.

Yet another object is to provide a digital measurement and display system wherein the data is displayed in a linear and/or digital format. Still another object is to provide a metering system wherein digital data is outputted in serial and/or parallel. A further object is to provide a metering system wherein output update is a function of the rate of change of the condition to be displayed.

An object of the present invention is to provide an improved metering system wherein the output display is multiplexed. Still another object is to provide an inexpensive, readily manufactured metering system.

These and other objects, features and advantages of the present invention appear in the description of a preferred embodiment.

BRIEF DESCRIPTION OF THE DRAWING

A preferred embodiment of the present invention is described, in detail, with reference to the drawing wherein:

FIG. 7 is a front view of a display panel for use in the output system shown in FIG. 1;

FIG. 8 is a series of graphs illustrating the actuation of a portion of the output system, shown in FIG. 1;

FIG. 9 is a series of graphs similar to FIG. 8 for a second portion of the output system.

DESCRIPTION OF THE PREFERRED EMBODIMENT

Figure 1:
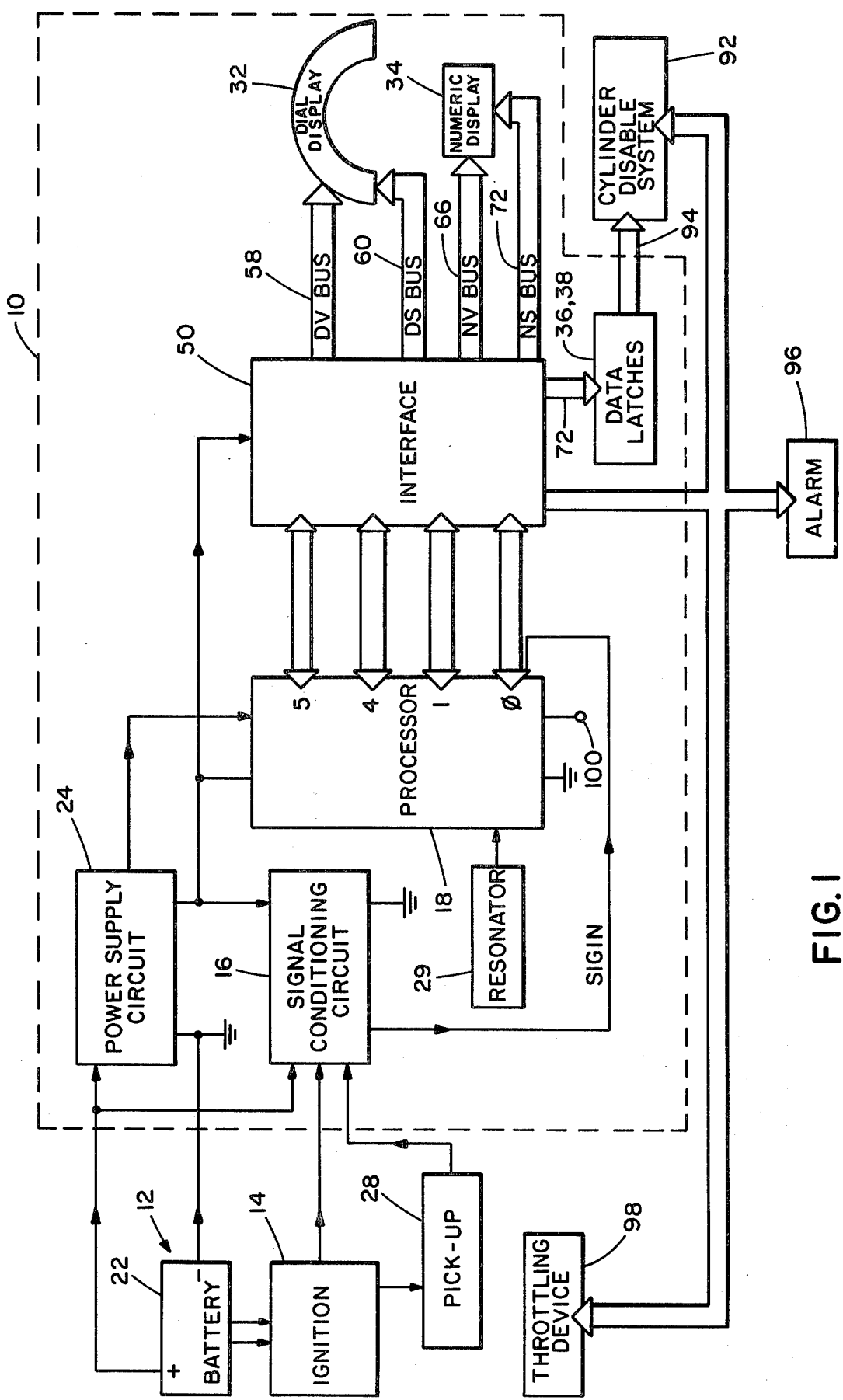
FIG. 1 is a block diagram of a tachometer incorporating a preferred embodiment of the present invention.

Referring to FIG. 1, a preferred embodiment of the present invention is shown as a metering system 10, operable as a tachometer to measure and display the speed (RPM) of an automotive engine 12. The automotive engine 12 includes an ignition system 14, which produces a primary and secondary coil voltage signal.

Although a tachometer embodiment is specifically disclosed herein, it is to be understood that the application of the metering system 10 is far more univeral. For example, and without limitation, the metering system 10 could be incorporated into an odometer, voltmeter or flow rate meter. Consequently, features of the metering system 10 shown herein, particularly those concerning output signals, may appear irrelevant to the tachometer operation. These features, however, become significant in other modes of operation.

The tachometer 10 includes signal conditioning circuit 16, processor 18 and output system 20. The signal conditioning circuit 16 receives an analog state-indicating signal and responsively produces a repetitive, digital two-state input signal, i.e., a signal compatible with the processor 18. The state-indicating signal varies to define a rate of change.

In this preferred embodiment of the present invention, the state-indicating signal is either the primary or secondary voltage signal of the ignition system 14. Although these signals are themselves repetitive, the application of the metering system 10 extends to all types of state-indicating signals. The only requirement is that the signal conditioning circuit 16 effectively convert the state-indicating signal to a repetitive digital signal. Here the selected signal, i.e. the primary or secondary signal, is determined by the accessibility of source.

Figure 2:
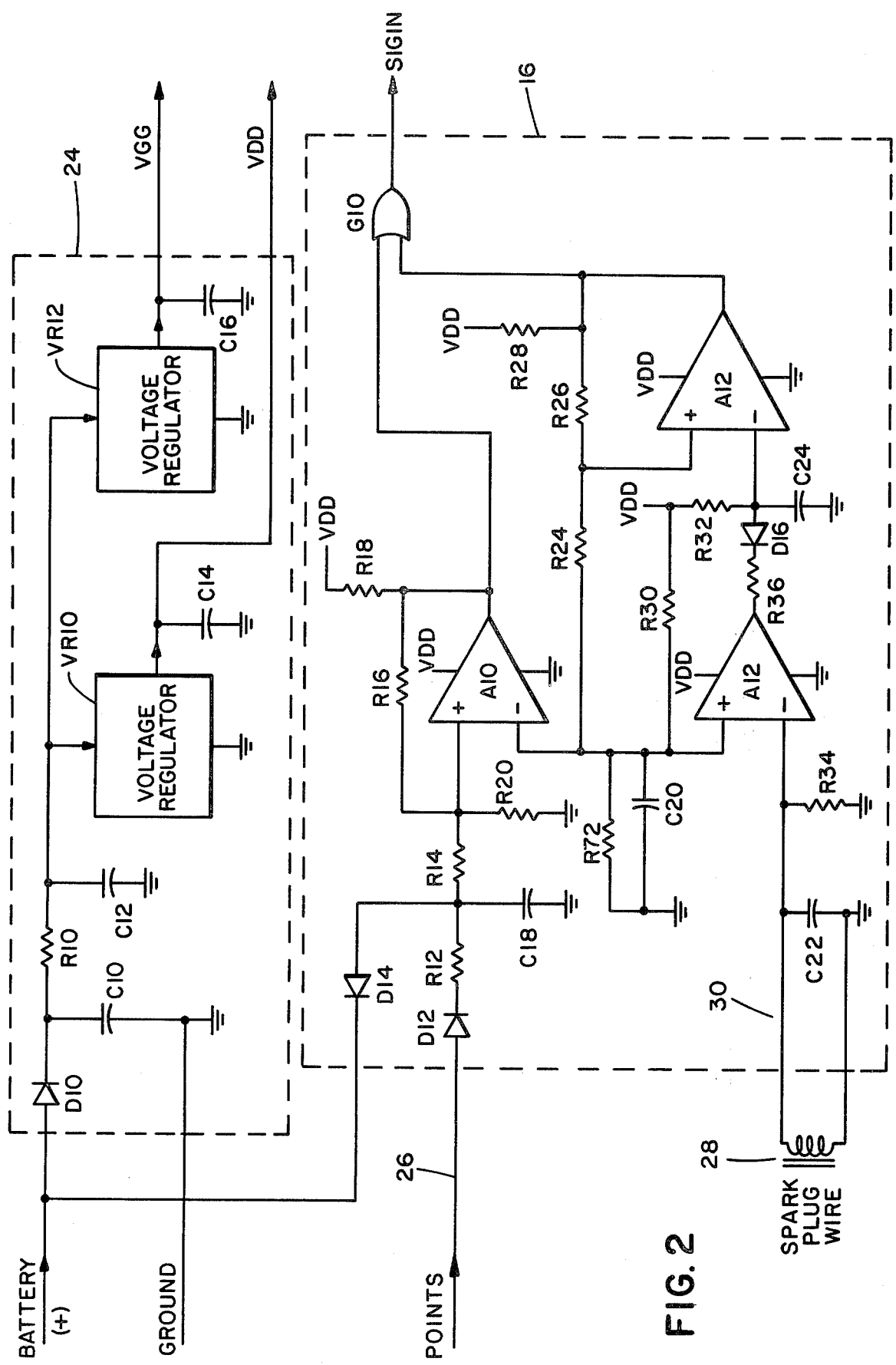
FIG. 2 is a schematic diagram of the power supply circuit and signal conditioning circuit shown in FIG. 1.

Referring now to FIGS. 1 and 2, the tachometer 10 is powered by the automotive battery 22 through a power supply circuit 24. The power supply circuit 24 includes resistor R10, capacitors C10-C16, diode D10 and voltage regulators VR10-VR12, interconnected as shown. The power supply circuit 24 provides two biasing voltages VGG and VDD, nominally twelve (+12) and five (+5) volts, respectively.

The positive terminal of the automotive battery 22 is connected to the input filter capacitor C10 through the diode D10. The diode D10 provides reverse polarity protection and substantially filters negative noise pulses. The resistor R10 and capacitor C12 provide additional noise filtering of the input voltage presented to the integrated circuit voltage regulators VR10, VR12. The regulators VR10, VR12 are commercially available regulators.

The signal conditioning circuit 16 is interconnected to the ignition system 14. The signal conditioning circuit 16 includes resistors R12-R36, capacitors C18-C24 diodes D12-D16, operational amplifiers A10-A14, operable as voltage comparators, and gate G10, interconnected as shown.

The primary coil signal is received on a conductor 26 connected to the breaker points (not shown) of a conventional ignition system 14 or the equivalent actuation point of an electronic ignition system. The secondary signal is received through a magnetic inductive pick-up coil 28, which couples the signal conditioning circuit 16 to one of the spark plug wires (not shown).

The primary ignition signal is processed through the diode D12, resistor R12 and capacitor C18. When the points open, the primary signal rings. The diode D12 rectifies the primary signal, and the positive peaks are stored on the capacitor C18. The diode D14 clamps the stored voltage to approximately the battery voltage. When the points close, the capacitor C18 discharges towards ground voltage.

The voltage on the resistor R20, V20, is time varying in accordance with the stored capacitor voltage. The voltage V20 switches from near ground voltage when the point close to a large fraction of the battery voltage when the points open.

The resistors R22, R30 operate as a voltage divider to provide a fixed reference voltage VREF for the comparators A10, A12. The capacitor C20 provides noise filtering.

Whenever the voltage V20 is less the reference voltage VREF, the output of the comparator A10 is low, i.e., near ground voltage. When the voltage V20 is more positive than the reference voltage VREF, the comparator output goes high.

The output of the comparator A10 is fed to the OR gate G10 to generate a digital input signal SIGIN, a logical representation of the primary signal, i.e., low whenever the points close and high otherwise. The signal SIGIN is a single logic, two-state signal compatible with the processor 18.

The resistor R16 provides a positive feedback and latching effect. This latching enhances switching speed and substantially improves noise immunity by introduction of hysteresis into the operational characteristics of the comparator A10.

Production of the signal SIGIN from the ignition secondary utilizes a tuned tank circuit 30, formed by the inductive pick-up coil 28 and capacitor C22. The coil 28 and capacitor C22 provide a resonant system which produces a high frequency oscillating signal in response to the secondary coil signal.

When the peak amplitude of the tank voltage signal, stored on the capacitor C22, exceeds the reference voltage VREF, the output of the comparator A12 goes low, rapidly discharging the capacitor C24 through the resistor R36 and diode D16. The capacitor C24 discharges until the reference voltage VREF exceeds the peak amplitude and thereafter slowly recharges to the supply voltage VDD through the resistor R32.

With initial ignition and discharge of the capacitor C24, the comparator A14 goes high. The output of the comparator A14 remains high until the capacitor C24 recharges to a voltage greater than the voltage established by the source VDD, the voltage VREF and resistors R24, R26, R28.

The output of the comparator A14 is connected to the gate G10 to produce the signal SIGIN. The resistors R24, R26 function in a similar manner to the resistor R16.

Figure 6:
FIG. 6 is a series of graphs illustrating the primary and secondary ignition signals and the signal SIGIN generated therefrom.

Referring to FIG. 6, the primary and secondary ignition signals are shown in (a) and (b). The signal SIGIN generated therefrom is shown in (c). It is to be understood that the primary signal occurs and generates a SIGIN high with the firing of each spark plug while the secondary signal occurs only once per engine revolution.

Figure 3B:
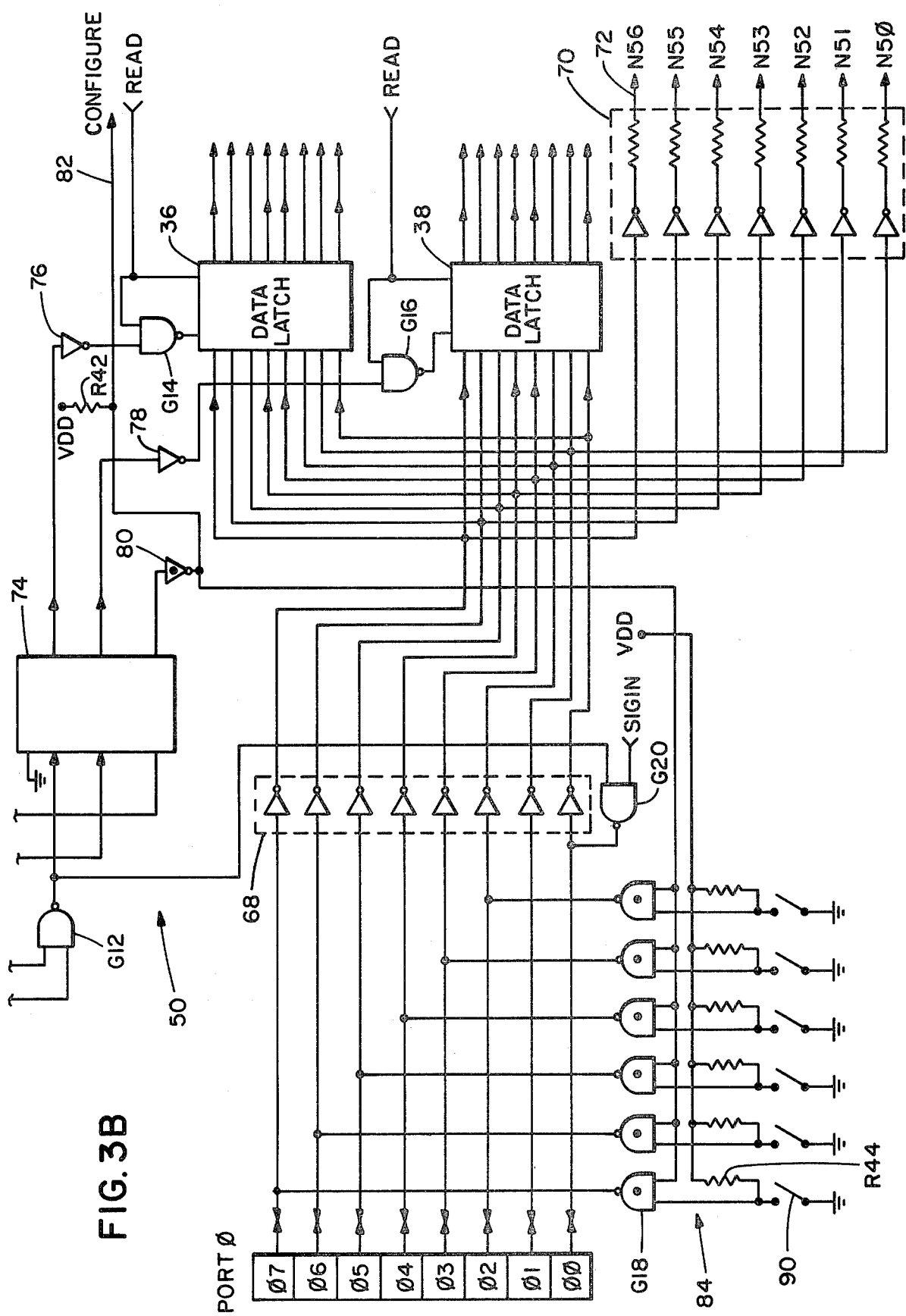
FIGS. 3 and 4 are schematic diagrams of the processor and interface shown in FIG. 1.
Figure 4:
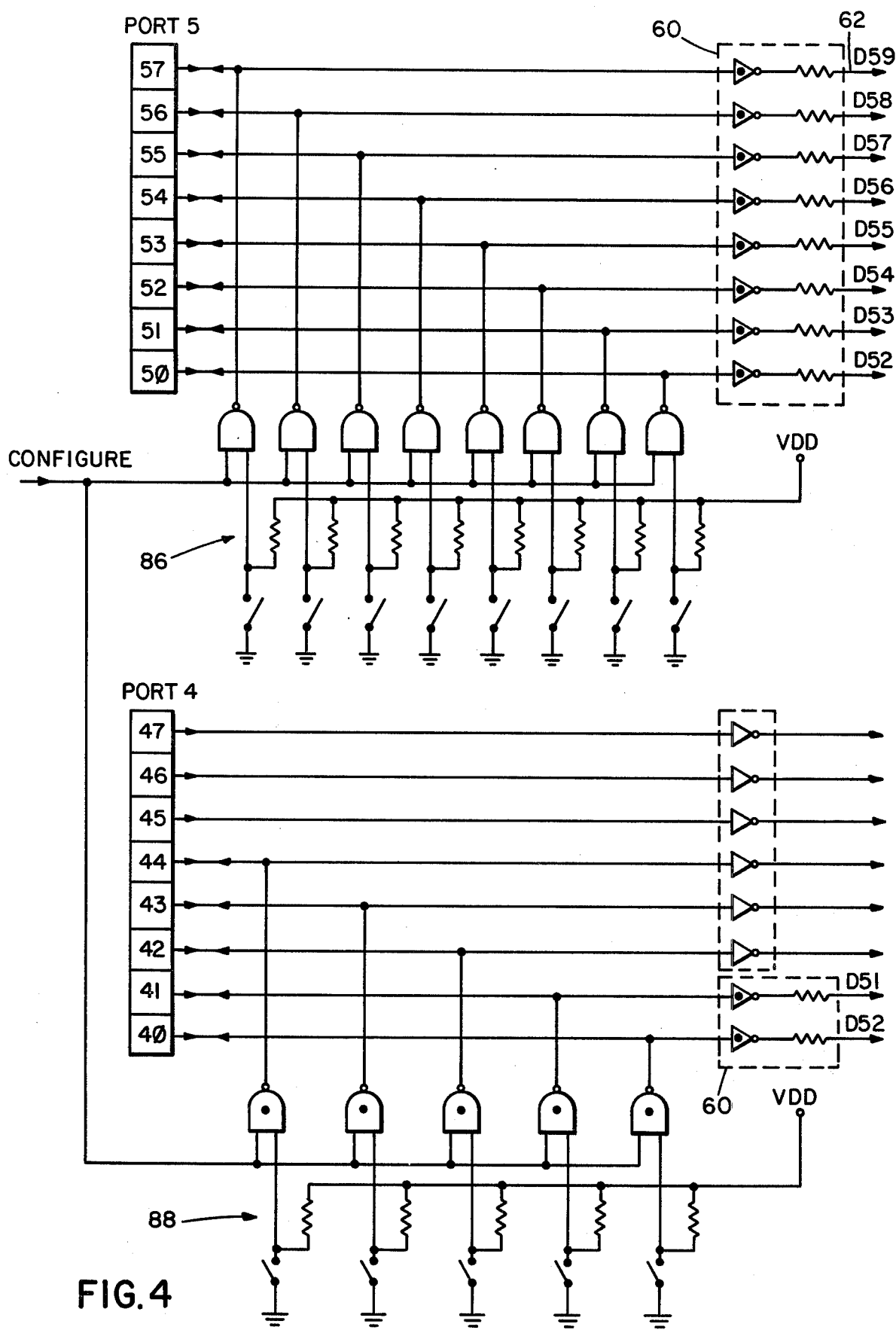

Referring now to FIGS. 1, 3 and 4, the processor 18 receives the signal SIGIN and provides output commands to drive the output system 20, such that the output system 20 displays the speed of the automotive engine 12. One suitable processor 18 is the F8 Microprocessor, manufactured and sold by Fairchild Camera & Instrument Corporation, San Jose, Ca. The processor 18 includes a control unit, arithmetic unit, oscillator and numerous read/write memories for temporary storage.

A microprogram is permanently stored in the control unit. A resonator 29, such as a piezoelectric crystal or a ceramic resonator, drives the oscillator of the processor 18 to provide an accurate real time base, i.e., timing pulses.

The processor 18 eliminates numerous hardware elements otherwise necessary for proper operation of the tachometer 10. The processor 18 is also mass producible thereby providing substantial cost savings.

The processor 18 has four (4) input/output ports, designated ports $\phi$, 1, 4 and 5, receipt and transmission of data. Each port $\phi$, 1, 4 and 5 has eight (8) separate input/output terminals, designated I/O AB, where A and B represent the port and terminal reference, respectively. As shown in FIG. 3, the processor 18 receives the signal SIGIN, under predetermined conditions, through I/O terminal $\phi\phi$.

The processor 18 repetitively samples the signal SIGIN at equal time intervals and manipulates the sampled data to determine the period thereof. The period is set by the leading edges of consecutive high states of the signal SIGIN. Sampling is directed by an internal timer within the processor 18, driven by the oscillator, and the number of samples within the period are stored in a read/write memory. The processor 18 inverts and proportions the number of samples, in accordance with various input parameters, to calculate the speed of the engine 12 and appropriately drive the output system 20.

The processor 18 also manipulates the sampled data to suppress noise and validate the high states of the signal SIGIN as true ignition events. The time periods for the high and low states are stored within the processor 18 and compared to predetermined, inputted values to ensure that the high states are sufficiently long and sufficiently spaced timewise.

Figure 5:
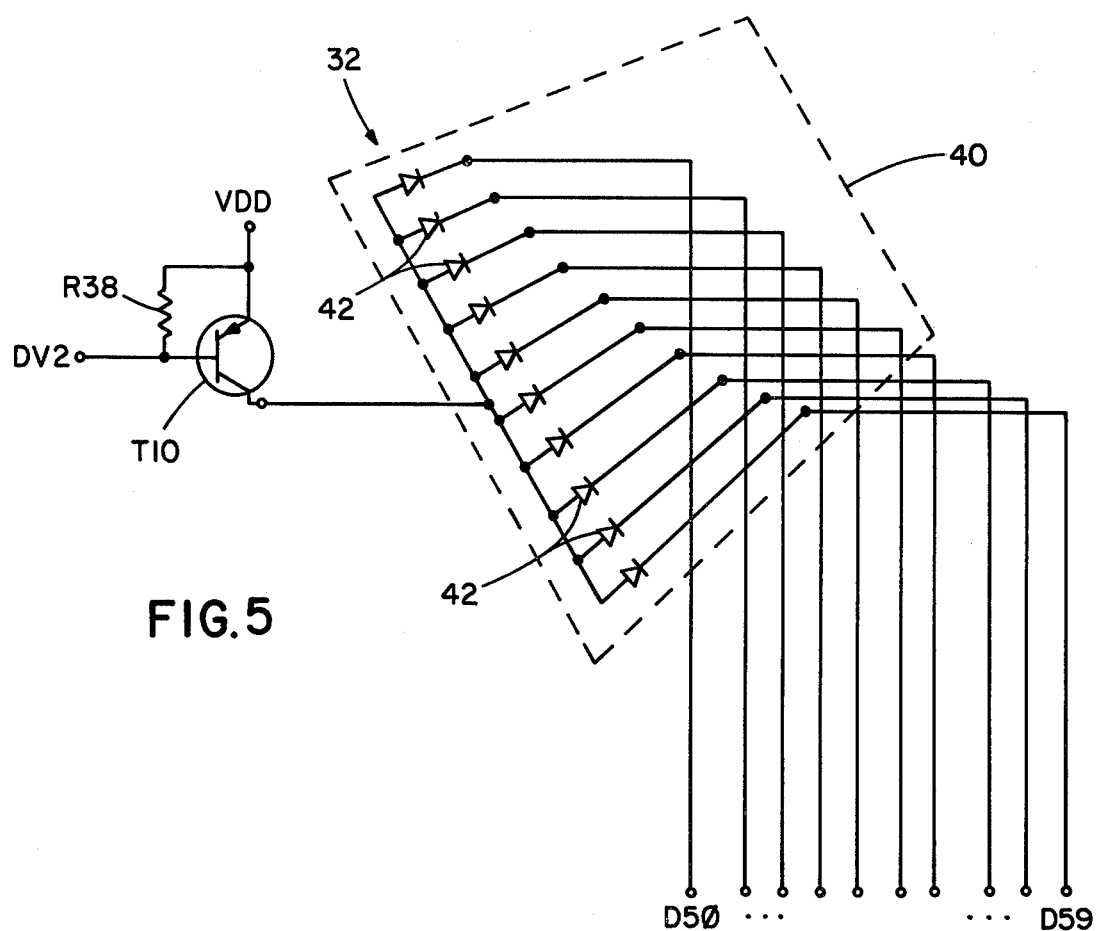
FIG. 5 is a partial schematic diagram of the output system shown in FIG. 1.

With reference to FIGS. 1, 3, 5 and 7, the output system 20 of the tachometer 10 includes a dial display 32, numeric display 34 and a pair of BCD data latches 36, 38. The dial display 32 incorporates groups 40 of output components 42, which, in this preferred embodiment, are ten (10) decades 40 of light-emitting diodes 42. A representative group 40 is shown in FIG. 5. Equivalent visual indicator devices could also be utilized, such as liquid crystal, gas discharge and incandescent devices.

The one hundred (100) diodes 42 are arranged in an arcuate configuration, substantially equally spaced about the perimeter of a circular display panel 44. The tenth or last diode 42 of each decade 40 is larger than the remaining diodes 42 therein to facilitate reading.

The dial display 32 also includes a transistor T10 and resistor R38, interconnected as shown. Appropriately driven by the processor 18, the transistor T10 enables the decade 40, i.e., permits components 42 thereof to be illuminated.

The numeric display 34 presents four (4) digits 46 centrally located on the display panel 44. Each digit 46 includes seven (7) light-emitting diodes 48, or the equivalent, in a figure "8" configuration, such that the numbers $\phi$-9 can be displayed. The digits 46 are enabled and illuminated in a manner identical to the decades 40 of the dial display 32, as shown in FIG. 5.

The dial display 32 and numeric display 34 cooperatively present engine speed such that the observer is aware of both absolute value and direction and rate of change. As such, the observer is fully apprised of information related to engine speed. The drift of a conventional analog meter is also substantially avoided.

The output system 20 is interconnected to the ports $\phi$, 1, 4 and 5 of the processor 18 through an interface 50. Referring to FIGS. 3 and 4, the I/O terminals 14-17 are connected to the ten (10) groups or decades 40 of the dial display 32 through inverters, collectively 52, a first 7445 decoder 54, buffers, collectively 56, and a ten (10) line DV bus 58. The output terminals I/O 4$\phi$-41 and 5$\phi$-57 are connected to the ten diodes 42 in each group 40 through a buffering-decoding system, generally designated 60, and a ten (10) line DS bus 62.

Similarly, the output terminals I/O 1$\phi$-13 are enablingly connected to the four digits 46 of the numeric display 34 through a buffering-decoding system, generally designated 64, and four (4) line NV bus 66. The output terminals $\phi$1-$\phi$7 are connected to the seven (7) diodes 48 of each digit 46 through inverters, collectively 68, buffering-decoding system 70 and a seven (7) line NS bus 72. The output terminals $\phi\phi$-$\phi$7 are also connected through inverters 68 to the data latches 36, 38, as shown. Each data latch 36, 38 provides an eight-bit output.

The interface also includes a second 7442 decoder 74 interconnected to the I/O terminals 14-15 and I/O terminals 16-17 through a gate G12. The output terminals of the second decoder 74 are connected, respectively, through an inverter 76 and gate G14 to the data latch 36, through an inverter 78 and gate G16 to the data latch 38, and through an inverter 80 and a CONFIGURE line 82 to a series of input systems 84, 86, 88 for inputting data to the processor 18. The source VDD is connected to the CONFIGURE line 82 through a resistor R42.

Each input system 84, 86, 88 includes combinations of a switch 90, resistor R44 and gate G18, singularly designated in FIG. 3 and interconnected as shown. The switches 90 are closed in accordance with operating conditions.

Under direction of the processor 18 and more particularly the output signal present at the I/O terminals 14-17, the interface 50 is operable in three modes, i.e., configure, transmission and display. The modes are defined in TABLE 1.

TABLE 1

| INTERFACE STATE | I/O 17 | I/O 16 | I/O 15 | I/O 14 |
|---|---|---|---|---|
| DISPLAY | 1 | 1 | 1 | 1 |
| " | 1 | 1 | 1 | 0 |
| " | 1 | 1 | 1 | 0 |
| " | 1 | 1 | 0 | 1 |
| " | 1 | 1 | 0 | 0 |
| " | 1 | 0 | 1 | 1 |
| " | 1 | 0 | 1 | 0 |
| " | 1 | 0 | 0 | 1 |
| " | 1 | 0 | 0 | 0 |
| " | 0 | 1 | 1 | 1 |
| " | 0 | 1 | 1 | 0 |
| TRANSMISSION | 0 | 0 | 1 | 0 |
| " | 0 | 0 | 0 | 1 |
| CONFIGURE | 0 | 0 | 0 | 0 |

In the configure mode, data from the input systems 84, 86, 88 is stored in the read/write memories of the processor 18. Through the gate G12, the gate G20 is disabled prohibiting input of the signal SIGIN to the processor 18.

The data available to the processor 18 through the input systems 84, 86, 88 is shown in TABLE 2, according to I/O terminal designation. This information provides the parameters necessary to properly display the speed of the automotive engine 12 under analysis.

TABLE 2

| I/O TERMINAL | |
|---|---|
| 02 | SERIAL BAUD RATE SELECT (HIGH/LOW) |
| 03 | LINEAR |
| 04 | DISPLAY |
| 05 | SCALE |
| 06 | FACTOR |
| 07 | AUTO/SET SCALING |
| 40 | |
| 41 | INPUT |
| 42 | SIGNAL |
| 43 | PROPORTIONALITY |
| 44 | CONSTANT |
| 50 | |
| 51 | |
| 52 | OVERRANGE |
| 53 | LIMIT |
| 54 | VALUE |
| 55 | |
| 56 | |
| 57 | |

The auto/set scaling and linear display scale factor data establishes the scales for the dial display 32. In this preferred embodiment, there are five groups haveing four scales therein: 10, 5, 2, 1; 9, 4, 2, 1; 8, 4, 2, 1; 7, 3, 2, 1; and 6, 3, 2, 1. The processor 18 selects the most appropriate scale within the chosen group.

The input signal proportionality constant represents the number of cylinders in the automotive engine 12 and the source of the signal SIGIN, i.e., the primary or secondary coil. The overrange limit sets the upper two digits, i.e., thousands and hundreds, of the maximum speed (RPM) for the engine 12.

In the transmission mode, the digital representation of engine speed (RPM) is stored in the data latches 36, 38. The interface 50, under direction of the processor 18, successively enables the data latches 36, 38 in the two transmission states, respectively. The processor 18 co-ordinately and successively provides the lower two and upper two digits of the engien speed at I/O terminals φφ-φ7. During transmission, the dial display 32 and numeric display 34 are disabled.

Referring to FIG. 1, the data latches 36, 38 are available as peripheral input devices to a system 92 remote from the tachometer 10, such as the automotive industry's proposed cylinder disable system. The data stored therein is available on a data bus 94. The gates G14, G16 prohibit data transmission to the latches 36, 38 during reading thereof by the remote system 92. That is, the remote system 92 disables the gates G14, G16 by an appropriate READ signal.

During the display states shown in TABLE 1, the engine speed (RPM) is visually displayed by the dial display 32 and numeric display 34. The processor 18 receives and samples the signal SIGIN and provides appropriate output command signals.

At output terminals I/O 14-17, the processor 18 successively provides the output commands listed in TABLE 1. Decoding these commands, the interface 50 successively enables each decade 40 of the dial display 32, as shown in FIG. 8(a) and (b). The enable periods are separated by periods wherein all decades 40 are disabled. In addition to the two transmission states shown in Table 1, disable of the decades 40 also occurs with the output signals shown in Table 3.

TABLE 3

| I/O | STATE 1 | STATE 2 | STATE 3 |
|---|---|---|---|
| 14 | 1 | 0 | 1 |
| 15 | 1 | 0 | 0 |
| 16 | 0 | 1 | 1 |
| 17 | 0 | 0 | 0 |

During the disable periods, the processor 18 establishes a second output signal at I/O terminals 4φ-41 and 5φ-57 to light the appropriate number of diodes 42 within each decade 40 thereof. The processor 18 refreshes the second output signal during each successive disable period. The second output signal is maintained throughout the decade enable period.

The numeric display 34 is similarly driven through I/O terminals 1φ-13 and φ1-φ7, as shown in FIG. 8(c) and (d). The digits 46 are successively and internittently enabled and an appropriate diodedriving signal is initialized during the intermittent total disable period. The output signals used to actuate the numeric display 34 are shown in Table 4.

TABLE 4

| I/O 13 | I/O 12 | I/O 11 | I/O 10 | STATE DEFINITION |
|---|---|---|---|---|
| 1 | 1 | 1 | 1 | Disabled |
| 1 | 1 | 1 | 0 | Digit 0 - NV0 Enabled |
| 1 | 1 | 0 | 1 | Digit 1 - NV1 Enabled |
| 1 | 0 | 1 | 1 | Digit 2 - NV2 Enabled |
| 0 | 1 | 1 | 1 | Digit 3 - NV3 Enabled |

Multiplexing of the output groups, decades 40 and digits 46, substantially avoids storage of the number of components to be enabled or actuated within each decade 40 or digit 46. With respect to the dial display 32, this reduces the required number of memories from eleven (11), one for each decade 40 and one for the decade count, to three (3), one for the highest decade 40 in which components 42 are enabled, one for the number of components 42 therein to be enabled and one for the decade count.

The multiplexing of the dial display 32 and numeric display 34, i.e., enabling and disabling, is accomplished in microseconds. As such, the "OFF" states are not perceptible to the human eye and, due to the multiplexing rate, the displays 32, 34 appear continuous.

The timing sequence of data transmission to the latches 36, 38 is shown in FIG. 9. As shown, the total disable period for the dial display 32 is divided into three segments. Data transmission occurs during the latter two segments.

As output, the processor 18 also provides pulsed and constant overrange signals at I/O terminals 44-45, respectively. The processor 18 sets the ON time of the pulsed overrange signal in proportion to the amount of overrange. As shown in FIG. 1, these signals can be utilized to actuate an alarm 96, a throttling device 98 to regulate engine speed (RPM), or the remote system 92. Selected scale indicating signals are available at I/O terminals 42-43 for display thereof.

When an overrange is detected, the processor 18 decreases the refresh rate of the output system 20. That is, data display is bypassed for a number of cycles, e.g., three, such that the dial display 32 and numeric display 34 appear to sequentially flash or pulse.

The processor 18, in response to an external request signal inputted on a line 100, provides in serial form the engine speed representation as stored in the BCD data latches 36, 38. The serial output, two consecutive data words, is available on I/O terminal 47 for transmission over a standard transmission line (not shown). Buffering of the serial output is required.

In this preferred embodiment, data acquisition by the processor 18 is terminated during serial transmission. The rate of transmission, as previously discussed, is determined by the data entered through I/O terminal φ2 during the configure mode.

The processor 18 also counts and stores the number of high states of the signal SIGIN. Whenever a predetermined pulse count is reached, the processor 18 resets the counter and provides an output signal at I/O terminal 46. This output signal can be used to actuate an external counter (not shown), such as an electromechanical counter.

Figure 10:
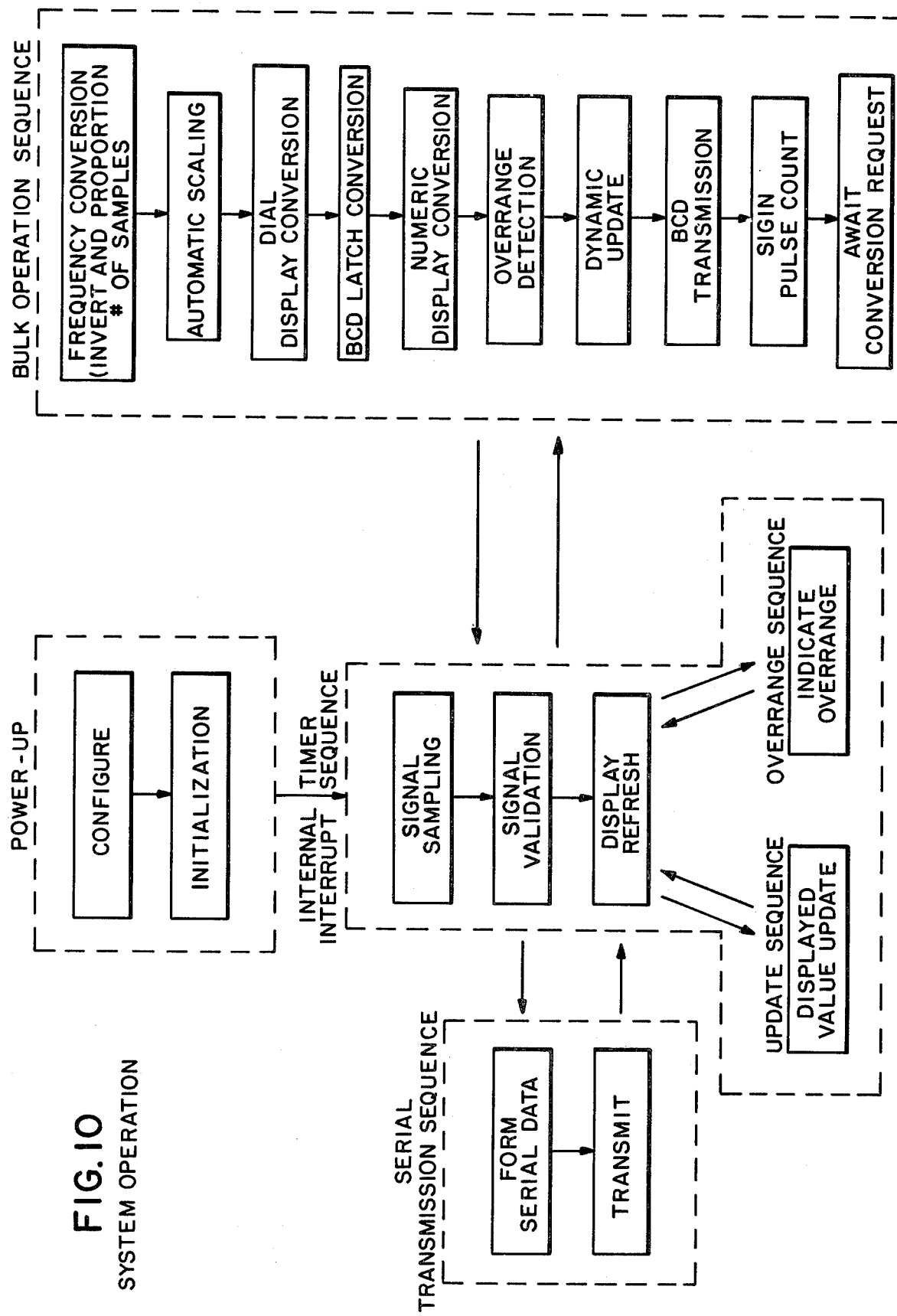
FIGS. 10, 11 and 12 are flowcharts of the sequential steps and operations performed by the processor shown in FIG. 1.
Figure 11C:
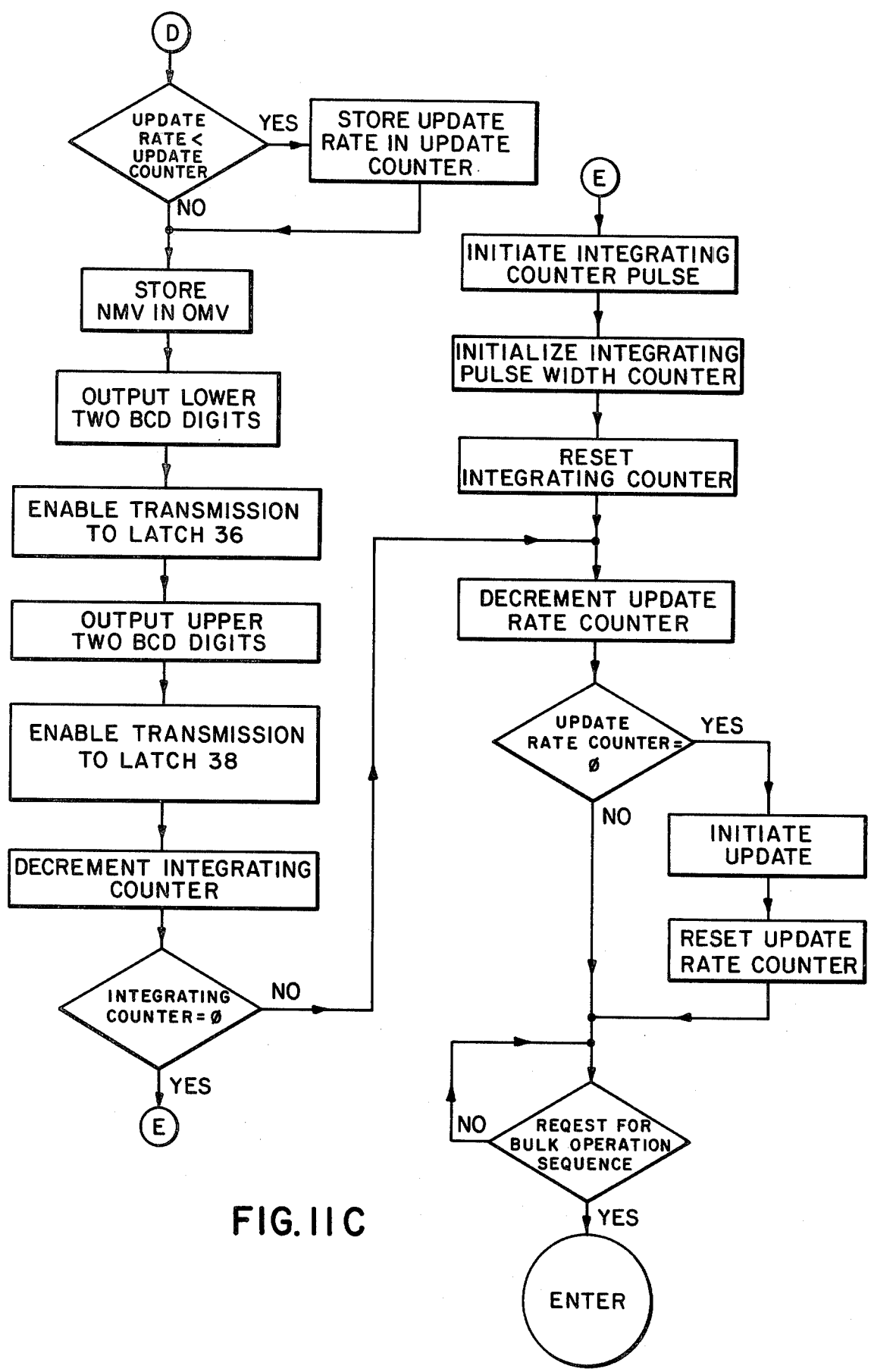
Figure 12B:
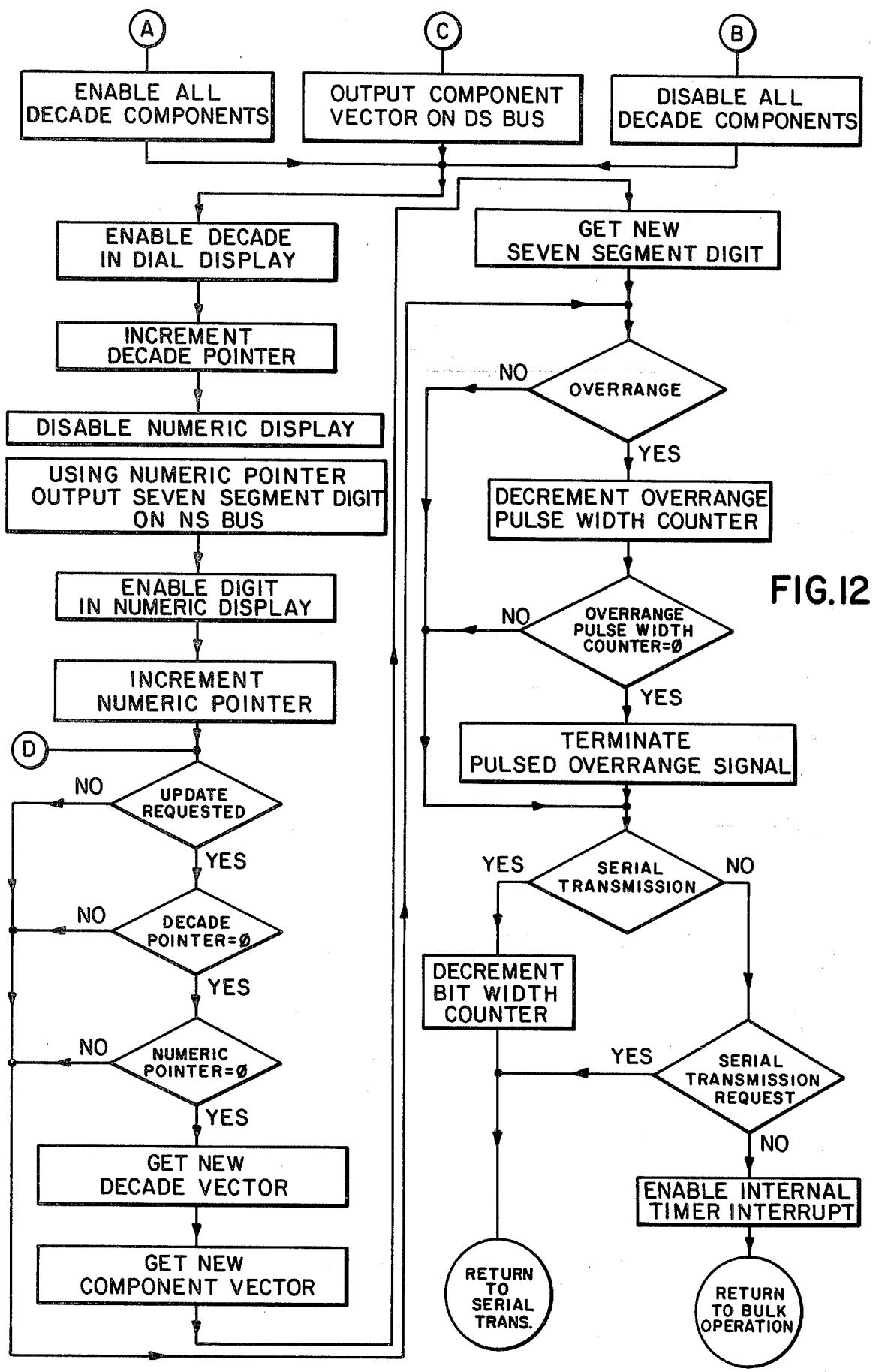

The operation of the processor 18 is shown, in detail, in FIGS. 10-12. With power-up, the processor 18 enters and remains in the internal timer interrupt sequence until a valid pulse on the signal SIGIN is sampled. Validation thereof initiates the bulk sequence operation.

Thereafter, the processor 18 successively operates in the bulk sequence mode and interrupt mode under direction of the internal timer. That is, at a repetitive time interval, the processor 18 switches to the interrupt mode. In this preferred embodiment, the time interval is three hundred (300) microseconds.

Referring to FIG. 11, the bulk operation sequence, the processor 18 initially calculates the frequency of the signal SIGIN. Conversion to a four (4) digit BCD (for storage in the data latches 36, 38), seven segment digit (for driving the numeric display 34), and a decade vector and component vector (for driving the dial display 32) is then made. The decade vector represents the highest decade 40 wherein components 42 are illuminated; the component vector is the number of components 42 to be illuminated in the highest decade 40.

the processor 18 updates the output system 20 at an update rate established by the rate of change in the state-indicating signal or more particularly the signal SIGIN. The processor 18 updates, in this preferred embodiment, at a rate substantially linearly proportional to the rate of change in the signal SIGIN.

More specifically, the update rate, UR, is determined by the following equation:

$$UR = A - Bx \frac{|NMV - OMV|}{OMV},$$

wherein A and B are integers. The processor 18 sets the maximum update rate at one (1), i.e., an update prior to each initial activation of the displays 32, 34.

In this preferred embodiment, A equals three thousand thirty (3030) and B is thirty-two (32) which defines a sufficiently fast minimum update rate to meet human patience requirements over the range of automotive engine operation. Choice of an integer power-of-two value for B minimizes system complexity, without sacrificing system performance.

As further shown in FIG. 11, the automatic scaling limits are one-quarter scale and three-quarters scale, respetively. This substantially avoids the undesirable repetitive switching of scales which occurs when approximately full scale is utilized as the upper scaling limit.

During the bulk operation sequence, the peocessor 18 also sets the overrange pulse width for the pulsed overrange output signal provided at I/O terminal 44. In this preferred embodiment, the pulse width and amount of overrange are contiguously linearly proportional.

Referring now to FIG. 12, the interval timer interrupt sequence, the processor 18 validates pulses of the signal SIGIN by predicting the state of the next sample. Assume a sufficiently long period of time has lapsed since the last valid pulse. The processor 18 now "looks for" a high pulse. Upon receipt thereof, the valid sample counter is decremented. This initial expected high sample must be followed by a sufficient number of high samples to exhaust the valid sample counter, validate the pulse as a true ignition event and initiate the bulk operation sequence for processing thereof. Inverse operation ensures sufficient pulse spacing.

As shown, the processor 10 updates the output signals, utilized to drive dial display 32 and numeric display 34, only during the total disable period immediately prior to enabling the first decade 40 and first digit 46. That is, it is required that both the decade pointer and numeric pointer of the processor 18 equal zero ($\phi$).

In overrange, the processor 18 terminates display of the measured engine speed until the refresh counter is decremented to zero ($\phi$). By initializing the refresh counter to three (3), the refresh rate is reduced by a factor of three, such that the dial display 32 and numeric display 34 flash.

Upon receipt of a serial transmission request, the processor 18 switches between the internal timer interrupt sequence and serial transmission sequence until transmission is completed. The processor 18 is initialized before bulk system operation is again instituted.

Various preferred embodiments have been disclosed herein. It is to be understood, however, that modifications and changes can be made without departing from the scope and spirit of the present invention as set forth and defined in the appended claims.

What is claimed is:

1. A metering system comprising in combination:
signal conditioning means for receiving a state-indicating signal and producing a digital input signal in response thereto;
processor means for processing said digital input signal, said processor means having at least a first and second output port, said processor means providing a first output signal at said first output port and a second output signal at said second output port, said first output signal and said second output signal having a predetermined relationship to said state-indicating signal; and
output means for displaying said first output signal and said second output signal, said output means including a group of output displays having a series of output components;
said first output signal successively enabling said output displays for a first predetermined time and disabling said output displays for a second predetermined time therebetween, said second output signal enabling a predetermined number of said output components within each of said output displays, said processor means refreshing said second output signal during said second predetermined time.

2. A metering system as claimed in claim 1 further comprising interface means for decoding said first output signal and said second output signal interposing said processor means and said output means.

3. A metering system as claimed in claim 1 wherein said output component is a light-emitting diode.

4. A metering system as claimed in claim 3 wherein said group includes ten (10) light-emitting diodes.

5. A metering system as claimed in claim 1 wherein said processor means includes an output display counter, said output display counter controlling said first output signal.

6. A metering system as claimed in claim 1 wherein said first output signal and said second output signal cooperatively define a value, said processor means updating said value at a rate dependent upon the rate of change of said state-indicating signal.

7. A metering system as claimed in claim 6 wherein said rate is substantially linearly proportional to said rate of change of said state-indicating signal.

8. A metering system comprising, in combination:
signal conditioning means for receiving a state-indicating signal and producing a digital input signal in response thereto, said state-indicating signal having a rate of change;
processor means for processing said digital input signal and responsively providing an output signal having a value related to said state-indicating signal, said processor means updating said value of said output signal at an update rate, said processor means measuring said rate of change of said state-indicating signal and varying said update rate in proportion to said rate of change of said state-indicating signal; and
output means for displaying said value.

9. A metering system as claimed in claim 8 wherein said update rate is substantially linearly proportional to said rate of change.

10. A metering system as claimed in claim 8 wherein said processor includes means for establishing said update rate in accordance with the following equation:

$$UR = \left[ \frac{OMV - |NMV - OMV|}{A} \right] A - Bx \frac{|NMV - OMV|}{OMV}$$

wherein UR, NMV, OMV, A and B represent said update rate, a newly measured value for said output signal, a previously measured value for said output signal, a constant and a constant, respectively, said processor means defining a maximum update rate of one (1).

11. A tachometer for measuring the speed of an automotive engine, said automotive engine having an ignition signal, said ignition signal having a rate of change, comprising in combination:
   signal conditioning means for receiving said ignition signal and producing a digital input signal in response thereto;
   processor means for processing said digital input signal, said processor means providing an output having a value related to said speed of said automotive engine;
   output means for displaying said value.

12. A tachometer as claimed in claim 11 wherein said signal conditioning means includes comparator means for comparing said ignition signal to a reference.

13. A tachometer as claimed in claim 11 wherein said processor means has at least a first output port and a second output port, said output including a first output signal and a second output signal available at said first output port and said second output port, respectively.

14. A tachometer as claimed in claim 13 wherein said output means includes a group of output displays, said output display having a series of output components, said first output signal successively enabling said output displays, said second output signal enabling a predetermined number of said output components within each output display.

15. A tachometer as claimed in claim 14 wherein said output display includes ten (10) light-emitting devices.

16. A tachometer as claimed in claim 15 wherein said output displays are arranged in a substantially arcuate configuration.

17. A tachometer as claimed in claim 14 wherein said group includes four (4) output displays having seven (7) output components arranged in an "8" configuration.

18. A tachometer as claimed in claim 11 further comprising interface means, operable in a display mode under the direction of said processor means, for interconnecting said processor means and said output means.

19. A tachometer as claimed in claim 18 wherein said output means further includes latch means for storing said second output signal.

20. A tachometer as claimed in claim 19 wherein said interface means is operable in a transmission mode for interconnecting said processor means and said latch means.

21. A tachometer as claimed in claim 18 further comprising input means for inputting data into said processor means.

22. A tachometer as claimed in claim 21 wherein said interface means is operable in a configure mode for interconnecting said processor means and said input means.

23. A tachometer as claimed in claim 11 wherein said processor means includes means for defining a predetermined maximum engine speed and means for producing an overrange signal whenever said value exceeds said predetermined maximum engine speed.

24. A tachometer as claimed in claim 23 wherein said processor means further includes means for proportioning said overrange signal to the amount of overrange.

25. A tachometer as claimed in claim 11 wherein said processor includes means for updating said output at an update rate related to said rate of change of said ignition signal.

26. A tachometer as claimed in claim 25 wherein said update rate is substantially linearly proportional to said rate of change.

27. A tachometer as claimed in claim 25 wherein said update rate is established in accordance with the following equation:

$$UR = \left[ \frac{OMV - NMV - OMV}{A} \right] A - Bx \frac{|NMV - OMV|}{OMV}$$

wherein UR, NMV, OMV, A and B represent said update rate, a newly measured value for said output signal, a previously measured value for said output signal, a constant and a constant, respectively, said processor means defining a maximum update rate of one (1).

28. A tachometer as claimed in claim 11 wherein said processor includes means for transmitting said output in serial format.

29. A tachometer as claimed in claim 11 wherein said processor includes means for validating said digital input signal.

* * * * *